US012782462B2

(12) United States Patent
Zwahr et al.

(10) Patent No.: US 12,782,462 B2
(45) Date of Patent: Nov. 3, 2026

(54) ELECTRICAL CONTACTING ELEMENT, AND MEASURING ASSEMBLY FOR MEASURING THE VOLTAGE IN A FUEL CELL SYSTEM

(71) Applicant: Schaeffler Technologies AG & Co. KG, Herzogenaurach (DE)

(72) Inventors: Sebastian Zwahr, Obermichelbach (DE); Thomas Swoboda, Nuremberg (DE); Andreas Nendel, Hessdorf (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 157 days.

(21) Appl. No.: 18/727,340

(22) PCT Filed: Nov. 10, 2022

(86) PCT No.: PCT/DE2022/100832
§ 371 (c)(1),
(2) Date: Jul. 9, 2024

(87) PCT Pub. No.: WO2023/138714
PCT Pub. Date: Jul. 27, 2023

(65) Prior Publication Data

US 2025/0172632 A1 May 29, 2025

(30) Foreign Application Priority Data

Jan. 20, 2022 (DE) ..................... 10 2022 101 247.6

(51) Int. Cl.
*G01R 31/40* (2020.01)
*H01M 8/04537* (2016.01)

(52) U.S. Cl.
CPC ........ *G01R 31/40* (2013.01); *H01M 8/04544* (2013.01)

(58) Field of Classification Search
CPC .............. G01R 31/40; H01M 8/04544; H01M 8/04865; Y02E 60/50; H01R 4/48
See application file for complete search history.

(56) References Cited

U.S. PATENT DOCUMENTS 1,724,729 A * 8/1929 Ruttenberg .............. H01R 4/48 439/828
2,309,311 A * 1/1943 Grohsgal ............. H01R 4/2495 439/418

(Continued)

FOREIGN PATENT DOCUMENTS

CN 100568600 C 12/2009
DE 1002435 B 2/1957

(Continued)

*Primary Examiner* — Giovanni Astacio-Oquendo
(74) *Attorney, Agent, or Firm* — Price Heneveld LLP

(57) ABSTRACT

An electrical contacting element for a bipolar plate is disclosed. The contacting element has the form of a folded sheet metal clamp, wherein a planar lower clamp part is integrally connected to a likewise planar upper clamp part by a connecting region that is linear when viewed from above, and is spring-loaded against the upper clamp part. The side lines that belong to the planar clamp parts and are opposite the connecting region are designed in such a way that, both when the bottom side of the sheet metal clamp is viewed from above and when the top side of the sheet metal clamp is viewed from above, one of the clamp parts is partially covered by the other clamp part.

13 Claims, 2 Drawing Sheets

(56) References Cited

U.S. PATENT DOCUMENTS

| | | | | | |
|---|---|---|---|---|---|
| 2,338,485 | A * | 1/1944 | Beyer | H01G 4/248 | 29/874 |
| 3,793,607 | A * | 2/1974 | Smith | H01R 4/42 | 439/806 |
| 3,853,389 | A * | 12/1974 | Occhipinti | H01R 13/114 | 439/852 |
| 5,282,761 | A * | 2/1994 | Hollingsworth | H01R 4/5083 | D13/149 |
| 5,934,949 | A * | 8/1999 | Richter | H01R 9/24 | 439/781 |
| 2010/0261081 | A1* | 10/2010 | Rock | H01M 8/0202 | 324/439 |
| 2012/0214362 | A1 | 8/2012 | Green | | |
| 2013/0273786 | A1 | 10/2013 | Ahangar | | |
| 2014/0300367 | A1* | 10/2014 | Paganelli | H01M 8/04552 | 324/434 |
| 2015/0380753 | A1* | 12/2015 | Taruya | H01M 8/04798 | 429/429 |
| 2017/0290717 | A1* | 10/2017 | Schoenbeck | B32B 5/26 | |
| 2018/0345819 | A1* | 12/2018 | Cai | B60L 58/31 | |
| 2023/0261220 | A1* | 8/2023 | Son | H01M 8/04303 | 429/432 |

FOREIGN PATENT DOCUMENTS

| | | | |
|---|---|---|---|
| DE | 102010010331 | A1 | 9/2011 |
| DE | 102011114936 | A1 | 4/2013 |
| DE | 102014225949 | A1 | 6/2016 |
| DE | 102018110870 | A1 | 12/2018 |
| DE | 202018006251 | U1 | 10/2019 |
| DE | 102018213688 | A1 | 2/2020 |
| DE | 102009053206 | B4 | 7/2020 |
| EP | 1900052 | B1 | 11/2018 |
| JP | 2007179876 | A | 7/2007 |
| WO | 2018193347 | A1 | 10/2018 |

* cited by examiner

ELECTRICAL CONTACTING ELEMENT, AND MEASURING ASSEMBLY FOR MEASURING THE VOLTAGE IN A FUEL CELL SYSTEM

CROSS-REFERENCE TO RELATED APPLICATIONS

This application is the U.S. National Phase of PCT Appln. No. PCT/DE2022/100832 filed Nov. 10, 2022, which claims priority to German Application No. DE 10 2022 101 247.6 filed Jan. 20, 2022, the entire disclosures of which are incorporated by reference herein.

TECHNICAL FIELD

The disclosure relates to an electrical contacting element designed as a sheet metal clamp. Furthermore, the disclosure relates to a measuring assembly for measuring an electrical voltage in a fuel cell system, which comprises a stack of electrochemical cells, namely fuel cells, with a plurality of bipolar plates.

BACKGROUND

EP 1 900 052 B1 discloses a bipolar plate which is composed of two half-sheets, namely what is termed a half cathodic bipolar plate and a half anodic bipolar plate. In addition to numerous other three-dimensional structures, the half-sheets form hollow receptacles into which electrical connection elements can be inserted for measuring purposes.

A further plug connector for measuring a cell voltage of a fuel cell is described in DE 10 2018 110 870 A1. In this case, a plug connector is mounted in a diagonal direction relative to the external shape of the fuel cells.

Various variants of electrical connection elements formed from sheet metal are described, for example, in the documents WO 2018/193347 A1, DE 20 2018 006 251 U1 and DE 1 002 435 B.

The documents DE 10 2010 010 331 A1 and DE 10 2009 053 206 B4 disclose electrical contacting elements which are designed for attachment to planar elements.

SUMMARY

The disclosure is based on the object of specifying methods for contacting electrically conductive planar components, in particular in the form of bipolar plates of electrochemical cells, which are more advanced than the prior art, wherein a high level of process reliability should be ensured even under series production conditions and application possibilities are sought, among other things, for densely stacked plates, as can be found in fuel cell stacks.

According to the disclosure, this object is achieved by an electrical contacting element having the features described herein. The contacting element can be used in a measuring assembly designed according to embodiments disclosed herein for voltage measurement in a fuel cell system.

The contacting element is a sheet metal clip with a folded basic shape. This means that the contacting element has at least an approximately U-shape in cross-section. Two planar clamp parts arranged essentially parallel to each other, which represent the two U-legs in cross-section, are referred to without restriction of generality as the lower clamp part and upper clamp part. When the clamp parts mentioned are viewed from above, they are integrally connected to each other by a linear connecting region. If the lower clamp part and the upper clamp part have a non-square basic shape, the connecting region can be located in particular on one long side of the clamp parts lying on top of each other.

Due to the spring-elastic properties of the sheet metal clamp, the planar clamp parts are spring-loaded against each other. The electrical contacting element is suitable for both automated and manual assembly processes. In both cases, the incomplete overlap of the two planar clamp parts makes it easier to bend the clamp parts during assembly. If the sheet metal clamp is gripped at the linear connecting region by hand or by a manipulator, which can be part of an assembly robot, the bending can be easily achieved by a slight rotary movement with which the lower clamp part is deflected slightly downwards and the upper clamp part slightly upwards. The direction information refers to a conceivable horizontal arrangement of the sheet metal clamp and does not imply any statement about the actual installation situation.

The two planar, plate-like clamp parts can have identical outer contours, whereby the lower clamp part emerges from the upper clamp part by mirroring on a mirror axis running orthogonal to the linear connecting region. The partial covering of one clamp part by the other clamp part is designed in particular in such a way that when one of the clamp parts is viewed from above, less than a quarter of the other clamp part is visible.

When the lower clamp part or the upper clamp part is viewed from above, the sheet metal clamp describes a modified rectangular shape according to various designs that are favorable for assembly. In this case, the side lines of the sheet metal clamp, which are opposite the linear connection region, can each be composed of several adjacent sections, wherein one of these sections is aligned to be at least approximately parallel to the linear connection region, and an adjoining section is inclined relative to the linear connection region. In both the lower clamp part and upper clamp part, the angled section can be longer than the first section.

Overall, the planar clamp parts can thus form a V-shaped incision on the side of the sheet metal clamp which is opposite the linear connecting region. Similarly, in case of curved contours of the clamp parts, a rounded recess can be formed on a side line of both clamp parts.

What is termed the linear connection region can be designed in such a way that a distance is created between the two planar clamp parts, wherein the distance is to be measured in the normal direction of the planar clamp parts, and typically corresponds approximately to the wall thickness of a plate, in particular a bipolar plate, to which the contacting element is to be attached.

In cross-section, the connecting region, which appears linear when one of the planar clamp parts is viewed from above, corresponds to a U-base to which the two U-legs, i.e., planar clamp parts, are connected. When assembled, the two planar clamp parts of the contacting element are spaced apart from each other by the electrical contacting plate located between these clamp parts.

As long as the contacting element is not yet attached to the plate, in particular the bipolar plate, there is a considerable preloading force between the clamp parts, which leads to the clamp parts contacting each other at the side lines thereof opposite the connecting region, but not in the vicinity of the linear connecting region. The preloading force can be set such that in the bending region, i.e., in the linear connecting region, the tensile strength of the material, i.e., heat-treated sheet metal, in particular steel sheet, is utilized between 50% and 99%. The sheet metal clamp, for example, has a material thickness of 50 μm to 200 μm. This makes the sheet metal clamp suitable for use with fuel cell stacks that have a cell spacing of approximately 1.0 mm to 1.2 mm.

The measuring assembly designed according to claim 9 for voltage measurement in a fuel cell system comprises at least one bipolar plate and a contacting element designed according to claim 1 which is attached to this plate. The wall thickness of the contacting element, for example, is in the range of 25% to 200% of the wall thickness of the bipolar plate. The bipolar plate can be constructed in a conventional manner from two half-sheets. Due to the low wall thickness of the contacting element, it requires practically no additional installation space within a stack of fuel cells.

According to an expedient further development, at least one planar clamp part, i.e., the lower clamp part and/or the upper clamp part, has at least one tongue acting in the sense of a barb, which is formed directly onto the clamp part in question. The tongues can be located in the middle region of the planar clamp parts, i.e., be spaced from the edges thereof.

The connecting region, which appears linear when the planar clamp parts are viewed from above, can be interrupted once or several times, i.e., it can be formed from individual connecting sections spaced apart from one another. In this case, a section located between two connecting sections can have a tab intended for connection to a cable, which is formed either on the lower clamp part or on the upper clamp part. In the other part of the clamp, there can be a recess at the corresponding point, which is created by punching out the tab. With regard to the spring properties of the sheet metal clamp, this recess is of no practical relevance.

BRIEF DESCRIPTION OF THE DRAWINGS

Several exemplary embodiments of the disclosure are explained in more detail below by means of drawings. In the drawings.

DETAILED DESCRIPTION

Figure 4:
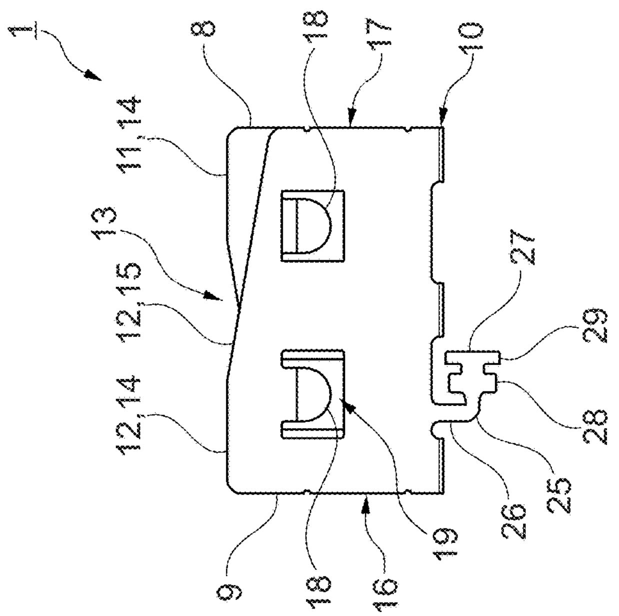
FIG. 4 shows a modified variant of a contact element in a view analogous to FIG. 1.

Unless otherwise stated, the following explanations relate to all the exemplary embodiments. Parts that correspond to each other or have basically the same effect are denoted with the same reference symbols in all the figures.

A bipolar plate, designated overall by the reference symbol 2, is intended for use in a fuel cell stack and has various ports 3, 4, 5 for the introduction of media. A distribution field of the bipolar plate 2 is designated with 6, an active field with 7. Ports for media output are not shown. With respect to the basic function of a bipolar plate 2, reference is made to the prior art cited at the outset.

A contacting element 1 attached to the bipolar plate 2 enables the measurement of the electrical voltage applied to the bipolar plate 2. The contacting element 1 has the basic shape of a folded sheet metal clamp, with a planar lower clamp part designated 8 and a likewise planar upper clamp part designated 9. The terms "lower part" and "upper part" are used without restriction of generality. In fact, in many applications, the bipolar plate 2 is located in a vertical orientation in a fuel cell stack. The bipolar plate 2 has an elongated rectangular shape, wherein the contacting element 1 is, for example, plugged into one of the shorter sides of the bipolar plate 2, as sketched in FIG. 5. Within the fuel cell stack, similar bipolar plates 2 are spaced apart by approximately 1.0 mm to 1.2 mm.

Figure 1:
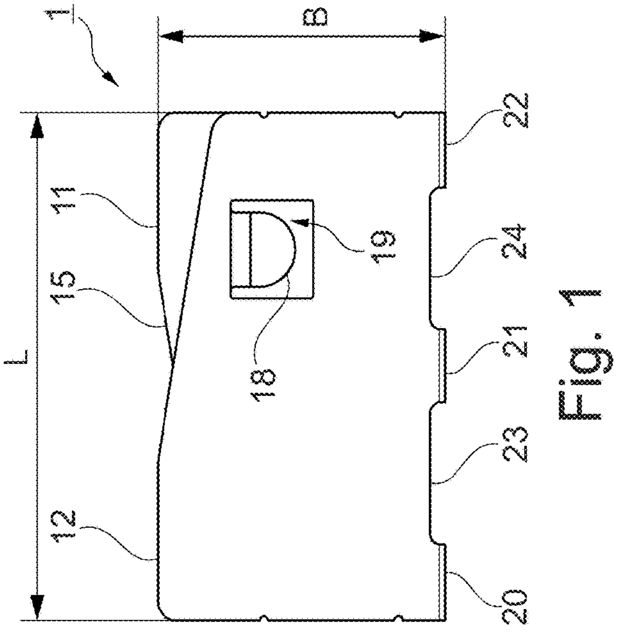
FIG. 1 shows a first exemplary embodiment of an electrical contacting element for a bipolar plate when viewed from above.
Figure 3:
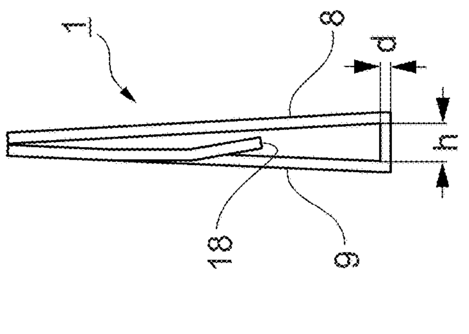
FIGS. 2 and 3 show the contacting element according to FIG. 1 in cross-sectional views.
Figure 2:
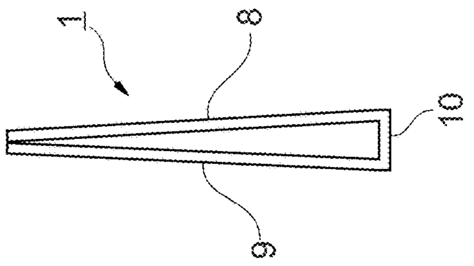
Figure 5:
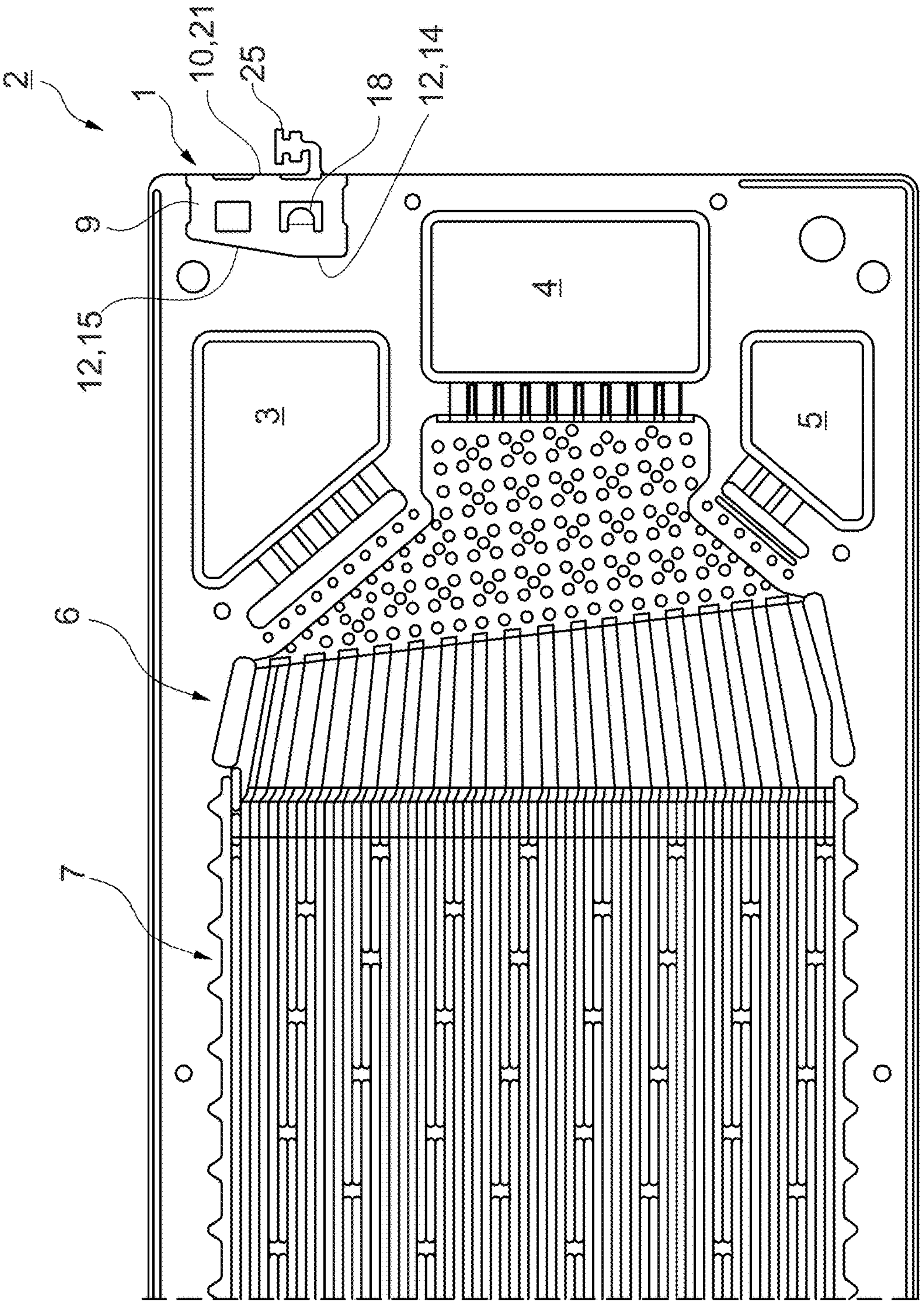
FIG. 5 shows a detail of a bipolar plate of a fuel cell with mounted contacting element.

The two planar clamp parts 8, 9 of the contacting element 1 are connected to one another by a comparatively narrow connecting region 10 which appears linear when viewed from above (FIGS. 1, 4, 5). In cross-section (FIGS. 2, 3), the connecting region 10 together with the clamp parts 8, 9 adjoining it describes a narrow U-shape, the clear width of which, to be measured at the connecting region 10, is designated by h and corresponds approximately to the wall thickness of the bipolar plate 2. The wall thickness of the contacting element 1 is designated by d and is significantly smaller than the wall thickness of the bipolar plate 2. When viewed from above, the contacting element 1 has a modified rectangular shape with a length L and a width B. The connecting region 10 extends over the total length L. The connecting region 10 is not exactly opposite side lines 11, 12 of the clamp parts 8, 9. Here, the side line 11 is also referred to as the front edge of the lower clamp part 8 and the side line 12 is also referred to as the front edge of the upper clamp part 9. Each side line 11, 12 is composed of a first section 14, which is arranged to be parallel to the connecting region 10, and a second section 15, which is arranged to be oblique to the linear connecting region 10. The first section 14 is shorter than the second section 15, so that a V-shaped incision 13 is formed at the front edges 11, 12 when viewed from above. In both the lower clamp part 8 and the upper clamp part 9, the first section 14 merges into a longer narrow side 16 and the second section 15 merges into a shorter narrow side 17 of the respective clamp part 8, 9.

Each clamp part 8, 9 can be represented as a combination of a rectangle and a trapezoid, whereby the rectangle is limited, among other things, by the longer narrow side 16 and the section 14 and the trapezoid is limited, among other things, by the shorter narrow side 17 and the section 15. The two rectangular-trapezoidal combinations, which are described by the clamp parts 8, 9, are arranged in mirror image to each other, with a mirror axis placed centrally between the two narrow sides 16, 17.

When the upper clamp part 9 is viewed from above, as shown in FIGS. 1 and 4, a partial surface of the lower clamp part 8 is also visible. The same applies when looking at the lower clamp part 8. In the non-assembled state (FIGS. 1 to 4), the clamp parts 8, 9 only touch each other in the region of the front edges 11, 12, as can be seen from FIGS. 2 and 3. The planar clamp parts 8, 9 are pressed together with preloading. The preloading is set in such a way that in the bending region, i.e., in the transition regions between the connecting region 10 and the clamp parts 8, 9, the tensile strength of the material, i.e., sheet metal, is utilized by 50% to 99%. The contacting element 1 is bent open for assembly purposes by bending the upper clamp part 9 slightly upwards and the lower clamp part 8 slightly downwards. This can be done either manually or with the help of a tool which engages the top of the clamp base 8 and at the same time the bottom of the upper clamp 9, and can be pivoted about the aforementioned mirror axis. As soon as the contacting element 1 is placed on the bipolar plate 2, as shown in FIG. 5, only one of the clamp parts 8, 9 is visible.

To prevent the contacting element 1 from being accidentally pulled off the bipolar plate 2, there is a tongue 18 in one of the planar clamp parts 8, 9, in the exemplary embodiments always in what is termed the upper clamp part 9, which acts in the manner of a barb. The tongue 18 can be deflected within a recess designated 19, which is located in the upper clamp part 9.

The connecting region 10, which is linear in shape in all embodiments, is formed from connecting sections 20, 21, 22 which are separated from one another, whereby intermediate regions in which the clamp parts 8, 9 are not connected to one another are designated by 23, 24. The missing direct connection between the clamp parts 8, 9 in the intermediate regions 23, 24 can be used to form a tab 25 which is punched out of one of the clamp parts 8, 9 and protrudes from the other clamp part 9, 8 in the usable, formed state of the contacting element 1, as can be seen in FIGS. 4 and 5. The tab 25 connects to the planar clamp part 8, 9 with a narrow transition region 26 which runs orthogonal to the connecting region 10. The narrow transition region 26 is followed by a contacting region 27, bent at 90°, which enables the connection of a cable for measuring purposes. The contacting region 27 comprises a first crossbar 28 and a second, front crossbar 29, wherein the crossbars 28, 29 are aligned to be parallel to each other and parallel to the narrow transition region 26, and thus enclose a right angle when viewed from above with the linear-appearing connecting region 10, that is to say with the U-base of the contacting element 1.

LIST OF REFERENCE SYMBOLS

1 Contacting element
2 Bipolar plate
3 Port
4 Port
5 Port
6 Distribution field
7 Active field
8 Lower clamp part
9 Upper clamp part
10 Connecting region
11 Lateral line, front edge of the lower clamp part
12 Lateral line, front edge of the upper clamp part
13 V-shaped incision
14 First section of the side line
15 Second, slanted section of the side line
16 Longer narrow side
17 Shorter narrow side
18 Tongue
19 Recess
20 Connecting section
21 Connecting section
22 Connecting section
23 Intermediate region
24 Intermediate region
25 Tab
26 Narrow transition region
27 Contacting region
28 First crossbar
29 Second crossbar
B Width
d Wall thickness of the contacting element
h Height, wall thickness of the bipolar plate
L Length

The invention claimed is:

1. An electrical contacting element in the form of a sheet metal clamp comprising:

a folded basic shape, a planar lower clamp part being integrally connected to a planar upper clamp part by a connecting region which is linear when viewed from above and is spring-loaded against the planar upper clamp part, and wherein side lines of the planar upper and lower clamp parts opposite the connecting region being designed such that both when a lower side of the sheet metal clamp is viewed from above and when an upper side of the sheet metal clamp is viewed from above, one of the upper and lower clamp parts is partially covered by the other one of the upper and lower clamp parts, wherein the side lines of the upper and lower clamp parts opposite the connecting region each have a first section running to be parallel to the connecting region and an adjoining section positioned to be oblique to the connecting region.

2. The contacting element according to claim 1, wherein the lower clamp part and the upper clamp part have identical outer contours and emerge from each other by mirroring.

3. The contacting element according to claim 1, wherein a V-shaped incision is described by the adjoining sections.

4. The contacting element according to claim 1, wherein it is made of sheet steel having a wall thickness of 50 μm to 200 μm as the material and a preloading force acts therein which utilizes the tensile strength of the material to a maximum of 50% to 99%.

5. The contacting element according to claim 1, wherein at least one tongue acting in the sense of a barb is formed on at least one of the planar upper and lower clamp parts.

6. The contacting element according to claim 1, wherein the connecting region, which appears linear when the planar upper and lower clamp parts are viewed from above, is formed from individual, spaced-apart connecting sections.

7. The contacting element according to claim 6, wherein on a section which lies between two connecting sections there is provided a tab for connection to a cable, which is formed on one of the planar upper and lower clamp parts.

8. A measuring assembly for voltage measurement in a fuel cell system, comprising at least one bipolar plate and a contacting element attached thereto and the contacting element comprising:

a folded basic shape, a planar lower clamp part being integrally connected to a planar upper clamp part by a connecting region which is linear when viewed from above and is spring-loaded against the planar upper clamp part, and wherein side lines of the planar upper and lower clamp parts opposite the connecting region being designed such that both when a lower side of the sheet metal clamp is viewed from above and when an upper side of the sheet metal clamp is viewed from above, one of the upper and lower clamp parts is partially covered by the other one of the upper and lower clamp parts, wherein the side lines of the upper and lower clamp parts opposite the connecting region each have a first section running to be parallel to the connecting region and an adjoining section positioned to be oblique to the connecting region.

9. The measuring assembly according to claim 8, wherein the contacting element has a wall thickness which is at least 25% and at most 200% of the wall thickness of the bipolar plate.

10. The measuring assembly according to claim 8, wherein the lower clamp part and the upper clamp part have identical outer contours and emerge from each other by mirroring.

11. The measuring assembly according to claim 8, wherein a V-shaped incision is described by the adjoining sections.

12. An electrical contacting element in the form of a sheet metal clamp comprising:

a folded basic shape, a planar lower clamp part integrally connected to a planar upper clamp part by a connecting region which is linear when viewed from above and is spring-loaded against the planar upper clamp part, and wherein side lines of the planar upper and lower clamp parts opposite the connecting region designed such that both when a lower side of the sheet metal clamp is viewed from above and when an upper side of the sheet metal clamp is viewed from above, one of the upper and lower clamp parts is partially covered by the other one of the upper and lower clamp parts, wherein the lower clamp part and the upper clamp part are represented as a combination of a rectangle and a trapezoid and have identical outer contours and emerge from each other by mirroring.

13. The contacting element according to claim 12, wherein the side lines of the upper and lower clamp parts opposite the connecting region each have a first section parallel to the connecting region and an adjoining section positioned to be oblique to the connecting region.

* * * * *